(12) United States Patent
Ausserlechner (10) Patent No.: US 9,231,118 B2
(45) Date of Patent: Jan. 5, 2016

(54) CHIP PACKAGE WITH ISOLATED PIN, ISOLATED PAD OR ISOLATED CHIP CARRIER AND METHOD OF MAKING THE SAME

(71) Applicant: Infineon Technologies AG, Neubiberg (DE)

(72) Inventor: Udo Ausserlechner, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/797,724

(22) Filed: Mar. 12, 2013

(65) Prior Publication Data

US 2014/0264677 A1  Sep. 18, 2014

(51) Int. Cl.
*H01L 29/82* (2006.01)
*H01L 21/50* (2006.01)
*G01R 15/20* (2006.01)
*H01L 27/30* (2006.01)
*H01L 27/22* (2006.01)
*H01L 41/12* (2006.01)
*H01L 41/00* (2013.01)
*H01L 27/14* (2006.01)
*H01L 27/20* (2006.01)

(52) U.S. Cl.
CPC .............. *H01L 29/82* (2013.01); *G01R 15/207* (2013.01); *H01L 21/50* (2013.01); *H01L 27/14* (2013.01); *H01L 27/20* (2013.01); *H01L 27/22* (2013.01); *H01L 27/30* (2013.01); *H01L 41/00* (2013.01); *H01L 41/12* (2013.01); *H01L 41/125* (2013.01); *H01L 2224/48091* (2013.01); *H01L 2224/48247* (2013.01); *H01L 2224/48464* (2013.01)

(58) Field of Classification Search
CPC ................. H01L 41/12; H01L 41/125; H01L 2924/13072; H01L 27/14; H01L 27/20; H01L 27/22; H01L 27/30; H01L 29/82; H01L 31/00; H01L 41/00; H01L 23/495; H01L 23/49575; H01L 23/52; H01L 23/28
USPC ................................................... 257/427, 678
See application file for complete search history.

(56) References Cited

U.S. PATENT DOCUMENTS

| | | |
|---|---|---|
| 2006/0033487 A1 | 2/2006 | Nagano et al. |
| 2006/0175674 A1 | 8/2006 | Taylor et al. |
| 2006/0194362 A1* | 8/2006 | Shirasaka ........................ 438/48 |
| 2010/0156394 A1 | 6/2010 | Ausserlechner et al. |
| 2011/0304327 A1* | 12/2011 | Ausserlechner .............. 324/239 |
| 2012/0181640 A1* | 7/2012 | von Koblinski et al. ...... 257/421 |
| 2013/0181304 A1 | 7/2013 | Milano et al. |

* cited by examiner

*Primary Examiner* — Peniel M Gumedzoe
(74) *Attorney, Agent, or Firm* — Slater & Matsil, L.L.P.

(57) ABSTRACT

A chip package with isolated pin, isolated pad or isolated chip carrier and a method of making the same are disclosed. In one embodiment a chip package includes a chip, a package encapsulating the chip, pads or pins disposed on a first side of the package and an isolation pad or an isolation pin disposed on a second side of the package, the isolation pin or the isolation pad electrically isolated from the chip, wherein the chip comprises a magnetic field sensor configured to measure a magnetic field generated outside of the package.

16 Claims, 7 Drawing Sheets

CHIP PACKAGE WITH ISOLATED PIN, ISOLATED PAD OR ISOLATED CHIP CARRIER AND METHOD OF MAKING THE SAME

TECHNICAL FIELD

The present invention relates generally to packaged chips and in particular, to packaged chips with an isolation pin or an isolated chip carrier.

BACKGROUND

In a semiconductor chip package, the semiconductor chip, or die, is embedded or housed within the chip package and the contact pads of the semiconductor chip are connected to external contact elements of the chip package.

Continuous technology improvements are under way in order to meet the demand for devices with smaller dimensions, enhanced performance, more diverse functionality and improved reliability.

SUMMARY OF THE INVENTION

In accordance with an embodiment of the present invention, a chip package comprises a chip, a package encapsulating the chip, pads or pins disposed on a first side of the package and an isolation pad or an isolation pin disposed on a second side of the package, the isolation pin or the isolation pad electrically isolated from the chip, wherein the chip comprises a magnetic field sensor configured to measure a magnetic field generated outside of the package.

In accordance with another embodiment a method for forming a chip package comprises disposing a chip on a chip carrier, the chip comprising a magnetic field sensor configured to measure a magnetic field outside a package, connecting the chip to a plurality of pins or pads on a first side of the chip carrier, generating an isolation pin or isolation pad on a second side of the chip carrier and encapsulating the chip with the package.

In accordance with another embodiment a system comprises a packaged chip including a chip, a package encapsulating the chip, pins or pads disposed on a first side of the package and an isolation pin or an isolation pad disposed on a second side of the package, the isolation pin or the isolation pad electrically isolated from the chip, wherein the chip comprises a magnetic field sensor configured to measure a magnetic field generated outside of the package. The system finally comprises a component carrier comprising a current trace.

In accordance with another embodiment a chip package comprises a chip carrier, an isolation layer disposed on the chip carrier, a chip disposed on the isolation layer and a package encapsulating the chip, the isolation layer and at least portions of the chip carrier. The chip package further comprises pads disposed on a first side of the package, wherein the chip comprises a magnetic field sensor configured to measure a magnetic field generated outside of the package.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Various embodiments recognize and take into account that it is desirable to maintain a position of a chip package comprising a magnetic field sensor relative to a current trace disposed in a printed circuit board (PCB). The current trace may carry the current to be measured by the magnetic field sensor. With some currently used configurations for the chip package, the package may change positions relative to the current trace over time. Consequently, inadequate distances between the magnetic field sensor and the current trace may result in inadequate current measurements. Accordingly, the magnetic field sensor may not function as desired.

Magnetic field sensors measure the current of a current trace in a printed circuit board via the magnetic field generated by the current. For large currents it is impossible to decrease the width of the current trace to an extent that the current trace fits between two lines of pins or pads of a SMD (surface mounted device) package. In order to measure the magnetic field as accurate as possible the magnetic field sensor is to be placed on the current trace and therefore pins of the SMD package are also to be placed on the current trace. However, placing the pins on the current trace is not desirable because either the isolation is destroyed by soldering the pins to the current trace or the SMD is not properly fixed attaching the SMD on the current trace without pins.

Prior attempts have addressed this problem by placing all pins at one side of the chip package and using an adhesive to secure the package body to the current trace. Yet, this technique is disadvantageous because the thickness of the adhesive is poorly controlled over lifetime (e.g., dwelling due to moisture uptake) and prohibits high operating temperatures. Moreover, dispensing an adhesive in the production line is expensive. A further disadvantage is that the chip package having no leads on one side may not be completely secured to the printed circuit board and therefore lift off from the printed circuit board.

Thus, various embodiments of the present invention teach forming a semiconductor chip package with a magnetic field sensor inside the package, the magnetic field sensor configured to detect a magnetic field (e.g., from a current flowing through a conductor) outside the package. The chip package may be attached (e.g., soldered) to a component carrier such that interconnection between the chip package and the component carrier remains stable over time.

Various embodiments use a novel configuration of the chip package in relation to a current trace disposed in the component carrier. Particularly, by electrically isolating a pin or lead protruding from one side of the chip package, the chip package may be mechanically attached to the component carrier in a manner that avoids galvanic contact and inadequate creepage distance between the current trace and the magnetic field sensor. As a result, various embodiments provide a device that increases the reliability of the magnetic field sensor over the lifetime of the packaged chip.

Figure 1:
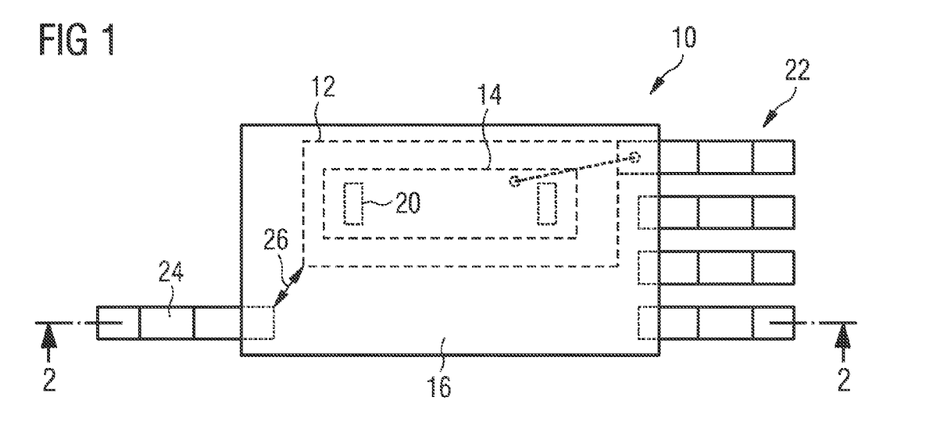
FIG. 1 illustrates a top view of a chip package with an isolation lead according to an embodiment of the invention.

With reference now to FIG. 1, a chip package 10 includes a chip carrier 12, a chip 14, a package 16, and pins (pins may also be referred herein as leads). As depicted in this plan view, the chip 14 is disposed on the chip carrier 12. In particular, the chip carrier 12 may be a leadframe and the chip 14 may be disposed on a die attach or die paddle 15 of the leadframe.

In the illustrative example, the chip 14 comprises a current sensor 20 such as a magnetic field sensor. In various embodiments the current sensor 20 may be a core-less magnetic current sensor (CLMCS) or an isolation data coupler. In various other embodiments the magnetic field sensor 20 may comprise a number of different types of sensors. For example, the current sensor 20 may be a Hall-effect device (e.g., a Hall plate or vertical Hall device), a magneto-diode or magneto-transistor, a magneto-resistor such as an anisotropic magneto-resistor (AMR), a giant magneto-resistor (GMR), a tunneling magneto-resistor (TMR) or other suitable types of magneto-resistive or giant magneto-impedance devices. In some embodiments the magnetic field sensor 20 may comprise two or more magnetic field sensors. For example, chip 14 may comprise two or more magnetic field sensors of the same or of different types, responsive to the same or to different directions of the magnetic field vector. The chip 14 may further comprise circuitry to process a magnetic field signal received by the magnetic field sensor.

The magnetic field sensor 20 may be used to measure the magnetic field produced by a current generated by a conductor external to the chip package 10. For instance, the magnetic field sensor 20 provides information about the current flowing through the current trace, wherein the current trace is supported by a printed circuit board (PCB).

In this view, the package or encapsulant 16 is comprised of a material used to encapsulate the chip carrier 12, the chip 14, as well as other components in the chip package 10. For example, the package 16 may comprise a molding compound such as a thermosetting material or a thermoplastic material.

The leads (or pins) 22 protrude from a first side of the chip package 10. The leads 22 are galvanically connected to the chip 14. The leads 22 are configured to provide electrical connectivity between the chip 14 and a component carrier (not shown). In this example, the upper most lead of the leads 22 is physically connected to the chip carrier 12. This lead may not have been separated from the chip carrier 12 before encapsulation with the package 16. The other three leads of the leads 22 have some physical separation from the chip carrier 12. However, these leads 22 are still electrically connected to the chip 14 through wire-bonding, for example. Although four leads 22 are shown in this view, more or fewer leads 22 may be present in some embodiments.

In this illustration, the isolation lead or pin 24 protrudes from a second side of the chip package 10. The second side is opposite the first side in this example. In other examples, however, the isolation pin 24 may protrude from a side adjacent to the first side with the leads 22. Of course, other configurations of pins may be realized, depending on the particular implementation.

An internal creepage distance 26 is present between the chip carrier 12 and the isolation lead or pin 24. The internal creepage distance 26 is the shortest distance between two adjacent conductive elements which are configured to be operated with different potentials. For example one conductive element is at the potential of an (outside) conductor (e.g., a high voltage potential) and the other conductive element is at the potential of the sensor circuit (e.g., a low voltage potential). The low voltage potential may be sensor ground or some potential that differs from sensor ground. For example, the low voltage potential may be several volts but not more than 100V. In this example, the internal creepage distance 26 is the shortest distance between the chip carrier 12 and the isolation pin 24.

In this depicted example, the isolation pin 24 is galvanically isolated from other components in the chip package 10 by the package material (e.g., mould compound) of the package 16. As a result, the isolation pin 24 serves as a mechanical anchor for attaching the packaged chip to a component carrier rather than an electrical connection to that component carrier. Because no current is supposed to flow over the isolation pin 24 into or out of the chip package 10, the isolation pin 24 may be very small. As a result, the isolation pin 24 has a minimum effect on the current distribution in the current trace of the component carrier to which it is attached.

While the isolation pin 24 may be small, the size of the isolation pin 24 must be sufficient such that it can hold the chip package 10 in place. In particular, the isolation pin 24 must be strong and large enough to prevent the chip package 10 from being bent away from the component carrier. This bending would increase the distance between the current trace in or on the component carrier and the magnetic field sensor 20 inside the chip package 10, which is undesired for reliable performance of the chip 14. The attach area of the pin may 0.4 mm×0.6 mm. Alternatively, the pin attach area may comprise other dimensions. It may be advantageous to have the attach area aligned to the current flow of the current trace of the component carrier so that it presents minimum disturbance to the current flow lines.

The isolation distance between the isolation pin 24 and the chip carrier 12 may be selected based on a number of different parameters. For example, this isolation distance may be selected based on the type of package material used for the package 16, the class of isolation to be achieved, the properties of the conductive components in the chip package 10, or other suitable parameters.

In various embodiments the isolation distance is determined by voids in the molding compound. According to the viscous properties of the mold and the processing parameters (temperature, gel time, molding pressure, mold channel geometry) the size distribution and occurrence of voids may change. In some embodiments the isolation distance must be large enough that a partial discharge in the gaseous atmosphere inside the voids is avoided even under worst case scenarios.

In some implementations, this distance may be 1 mm. Of course, the isolation distance may be more or less, depending on the functionality involved. In some instances, the isolation distance may reach 3 mm.

In various embodiments, the isolation pin 24 serves as a mechanical connection between a component carrier and the chip package 10 such that the chip package 10 remains in a well-defined position relative to the component carrier. Further, the use of the isolation pin 24 may not require the chip package 10 to be glued to the component carrier using an adhesive.

Figure 2:
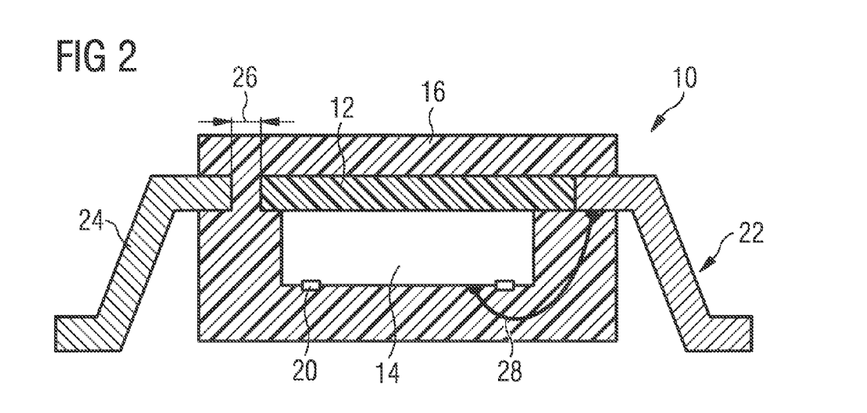
FIG. 2 illustrates a cross-sectional view of a chip package with an isolation lead according to an embodiment of the invention.

FIG. 2 illustrates a cross-sectional view of the chip package 10 with the isolation pin 24 taken along lines 2-2 in FIG. 1. In this view, a lead of leads 22 is galvanically or electrically connected to the chip 14 by bond 28. Other leads of the leads 22 may also be bonded to the chip 14 (not shown).

Although the leads 22 and pin 24 are shown as having a particular shape, other shapes may be provided. Moreover, although this illustration of the chip package 10 shows four leads 22 and one isolation pin 24, additional leads and isolation pins may be added, depending on the functionality of the chip package 10. Each of these leads and isolation pins may be attached (e.g., soldered) to a component carrier (e.g., PCB) using surface mount technology. The galvanically isolated pins may be placed on (an) other side(s) of the chip package 10 than the electrically connected leads. In this manner, the chip package 10 may be manufactured to the precise needs of the component manufacturer to provide adequate stability of the device over the lifetime of its use.

If the package 10 comprises more than one isolation pin 24 the isolation pins 24 may be arranged as follows: 1) All isolation pins 24 are separated and isolated from each other. 2) Groups of isolation pins 24 can be formed by electrically connecting the isolation pins 24. For example, the isolation pins 24 may be part of a single leadframe or may be connected via bond wires or other interconnects. In the latter case it is advantageously to place the isolation pins 24 at equipotential lines on the current trace in the component carrier—such an arrangement may avoid current flow over the isolation pins 24.

Figure 3A:
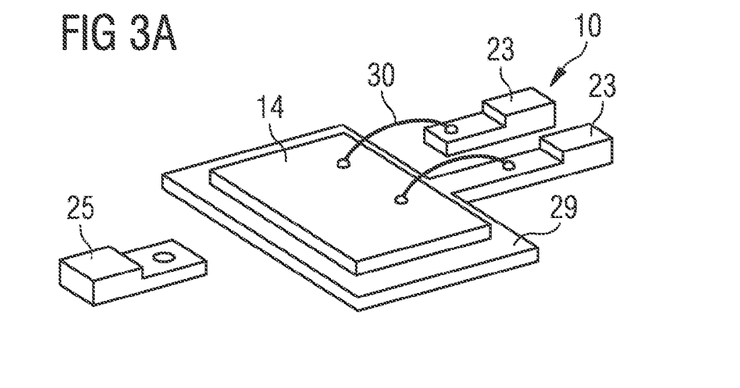
FIGS. 3A-3C illustrates embodiments of a chip package with an isolation pin.
Figure 3B:
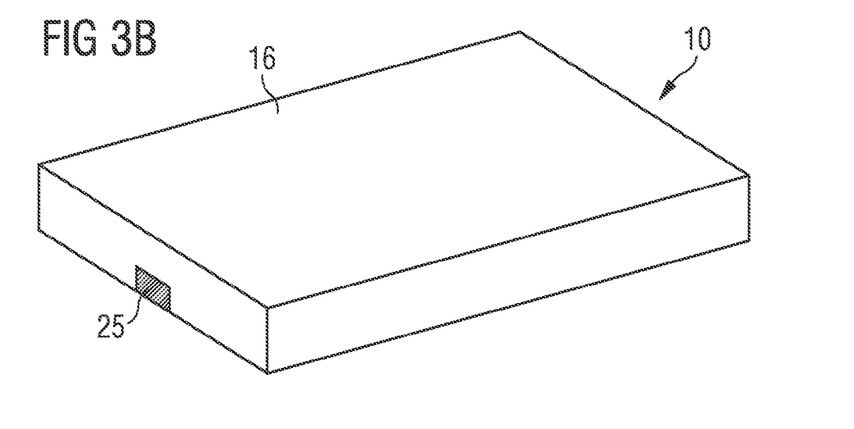
Figure 3C:
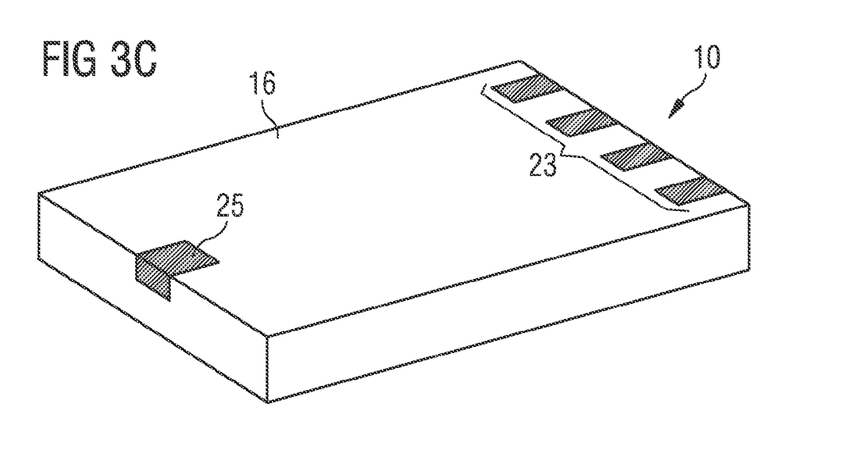

FIGS. 3A-3C illustrate an alternative configuration for the chip 14 with the pads. Particularly, the chip package 10 may be a "leadless" package, e.g., the chip package 10 may not have external leads in these examples. Instead, the chip package may have contact pads to provide electrical and mechanical connections to a component carrier (e.g., PCB).

FIG. 3A shows the chip 14 disposed on the top surface of the chip carrier 12. In this instance, the chip carrier 12 is a die paddle 29. The pads 23 on the right side of the chip package 10 are galvanically connected to the chip 14. For example, the pads 23 are wire-bonded to the chip 14 by wire bonds 30. The isolation pad 25 has an internal isolation distance from the die paddle 29. Alternatively, the chip 14 is disposed on the bottom surface of the chip carrier 12 (not shown).

In this illustrative example, the die paddle 29 is half-etched. In other words, a portion of the surface of the die paddle 29 has been removed. This etching may be desirable so that only a small portion of the pads 23 are exposed from the chip package 10. When a portion of the die paddle 29 is etched, the encapsulation or packaging material in the package 16 may flow into the etched portion of the die paddle 29 thereby covering the paddle 29.

FIG. 3B illustrates a perspective view of the top of the chip package 10 once the package 16 is added. Similarly, FIG. 3C illustrates a perspective view of the bottom of the chip package 10. Contact pads 23 and an isolation pad 25 are shown in these illustrative examples. In other words, instead of a large portion of the leads 22 and the isolation pin 24 being located outside of the chip package 10, as shown in FIG. 1 and FIG. 2, only pad 23 and 25 are exposed. Thus, portions of the pads are encapsulated by the package 16.

In this particular embodiment, the contact pads 23 serve the traditional purpose of holding the package in place and making galvanic connection to the electronic circuit inside the chip package 10. Akin to the isolation pin 24 in FIG. 1, the isolation pad 25 has a sufficient surface area such that the chip package 10 is secured to a component carrier. The isolation pad 25 has the purpose of holding the chip package 10 in place and simultaneously guaranteeing a high isolation voltage between the current trace and the magnetic field sensor 20.

Figure 4A:
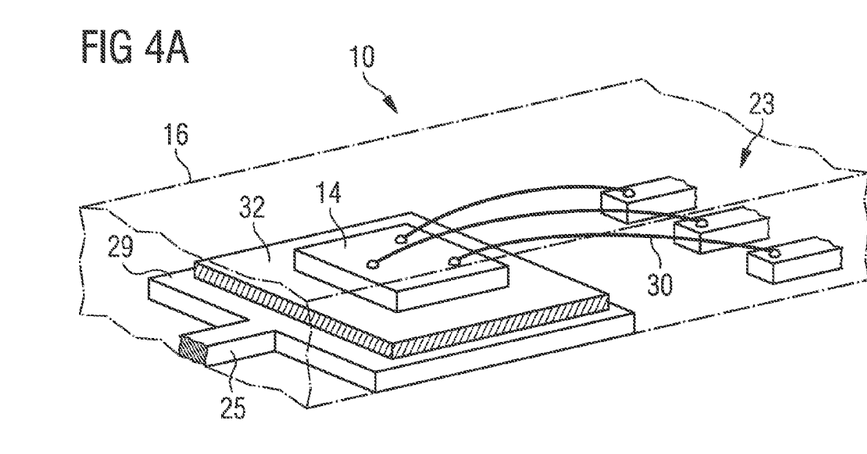
FIGS. 4A and 4B illustrates embodiments of a chip package with an isolation chip carrier.
Figure 4B:
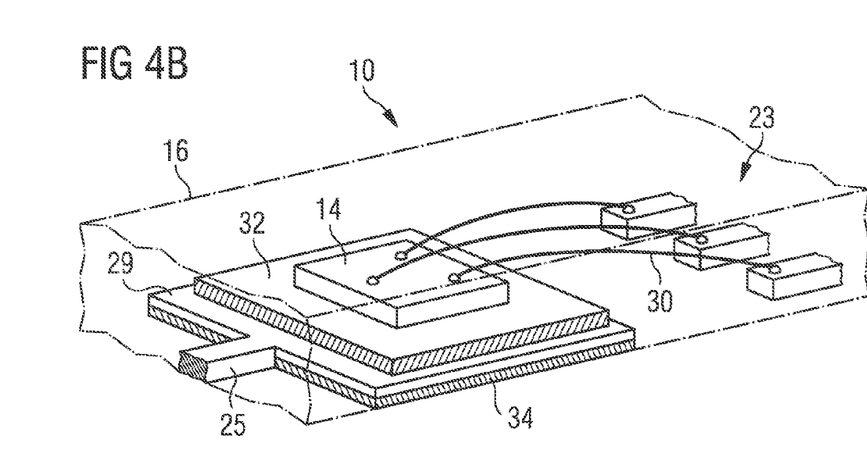

FIGS. 4A and 4B illustrate additional configurations of the chip package 10. In these figures, the package 16 is shown in phantom so that the components within the chip package 10 may be seen more clearly.

In FIG. 4A, an isolation layer 32 is present between the chip 14 and the die chip carrier 29. The isolation layer 32 may comprise a dielectric material. The dielectric material may comprise a material with a dielectric strength of 1 kV/mm to 100 kV/mm or 1 kV/mm to 10 kV/mm. The dielectric material of the isolation layer 32 may comprise ceramic, glass, oxide coatings or polyimide. The isolation layer 32 may be an isolation plate comprising ceramic platelets or glass platelets. Alternatively, the isolation layer 32 may comprise Kapton® foil, paper foil or cellulose foil. The isolation layer 32 may comprise a larger area than the chip 14. For example, the ceramic platelets or glass platelets may comprise a larger area than the chip 14 in order to protect the edges of the packaged chips 14.

In some embodiments the isolation layer 32 offers better voltage isolation than mold compound, because it does not have voids with trapped gas inside. So the physical structure and chemical purity (i.e. quality) of the dielectric layer 32 may be a better isolator than the mold encapsulation material.

A portion of the chip carrier 29 shown in this figure is exposed from the chip package 10. In this instance, the exposed portion of the die paddle 29 provides a stable connection to a component carrier such as a printed circuit board. The entire bottom surface of the die paddle 29 may be attached (e.g., soldered) to the component carrier in this example.

Although the current may flow in the chip carrier 29 in this configuration, the current does not flow into the chip package 10 because no portion of the chip carrier 29 is electrically connected to any additional electrical connection. Thus, the chip package 10 is secured to the component carrier but the magnetic field sensor may still remain isolated from the current trace disposed in the component carrier.

In FIG. 4B, the chip carrier 29 is completely encapsulated by the chip package. The chip carrier portion 34 of the chip carrier may be thinner than a typical chip carrier. For example, the chip carrier may comprise half the thickness of a typical leadframe. The typical leadframe thickness may be 100 μm to 1000 μm, or alternatively 200 μm and the half etched leadframe may be 50 μm to 500 μm, or alternatively 100 μm. The leadframe may be etched by a chemical etch process.

After the chip carrier portion 34 is etched away from the chip carrier 29, a molding material of the chip package 16 may flow under the chip carrier 29 in to portion 34 in order to encapsulate the chip carrier 29. Thus, only a small isolation pad 25 may be exposed at the bottom left side of the chip package 16. This isolation pad 25 is attached (e.g., soldered) to the component carrier. With the use of the isolation pad 25 attached to the component carrier, only a minimal effect on the current density in the current trace of the component carrier may be observed.

The exact layout of the exposed pads and isolation pads shown in FIGS. 3A-4B may be optimized with respect to surface tension of the solder used to connect the pads and isolation pads to the component carrier. For instance, when the solder liquefies, it exhibits a surface tension which pulls the exposed metal parts of the chip package 10 toward the component carrier. Therefore, symmetric layouts may be preferable.

In one example, the chip package 10 may be configured with two isolation pads near the left two corners of the package so that the chip package 10 is pulled uniformly toward the component carrier in order to avoid tilts of the chip package 10 against the component carrier. It is desirable to avoid tilts that increase the vertical distance between the magnetic field sensor 20 and the current trace of the component carrier. In still other examples, three isolation pads spaced equally from each other may be used. Thus, the configuration of an illustrative embodiment is not limited to the configurations described herein.

Figure 5A:
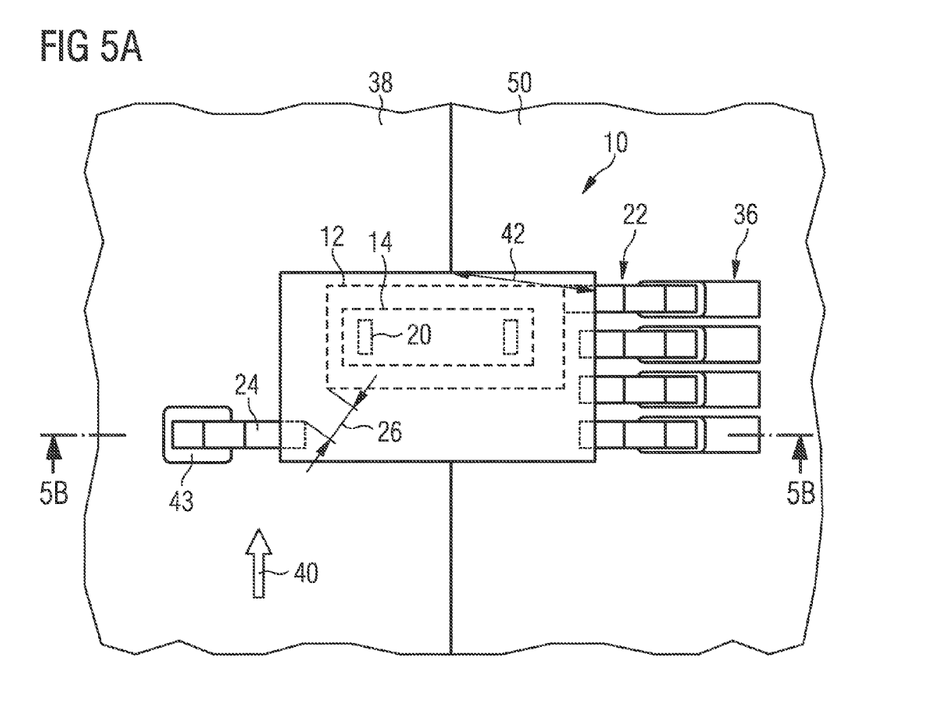
FIG. 5A illustrates a top view of a chip package with an isolation lead attached to a component carrier according to an embodiment of the invention.

FIG. 5A shows the chip package 10 attached to the component carrier. In this particular example, the leads 22 are attached to component carrier pads (e.g., low-voltage sensor traces) 36 and the isolation pin (or lead) 24 is mounted to the current trace 38 supported by a component carrier 50. Current may flow in the direction of arrow 40 along current trace 38. Solder 43 may attach the isolation pin 24 to the current trace 38.

As can be seen in this plan view, the chip package 10 is oriented such that half of the length of the chip package 10 overlaps the current trace 38. In other words, the right edge of the current trace 38 runs over the middle of the chip package 10. However, this configuration may be altered in other illustrative examples.

A creepage distance 42 is present in addition to the internal creepage distance 26. The creepage distance 42 is the distance between the wire galvanically connecting the chip to the low voltage leads 22 and the current trace 38. In various embodiments distance between the magnetic field sensor 20 and the current trace 38 should be as small as possible so that the magnetic field sensor 20 can measure a strong magnetic field per amp. However, small distances between the current trace 38 and the magnetic field sensor 20 may require higher dielectric isolation than the molding compound can provide.

In various embodiments such an isolation strength may be provided by a dielectric coating (e.g., oxide layer or nitride layer) on the top of the chip 14 (e.g., on the side of the chip 14 that faces the component carrier 50). In some embodiments the bond loops 28 are placed as laterally away as possible from the edge of the current trace 38 in order to increase this distance to the edge of the current trace 38. This distance may be more or less than shown in this figure, depending on the placement of the bond 28 and the overlap of the chip package 10 with the current trace 38.

Figure 5B:
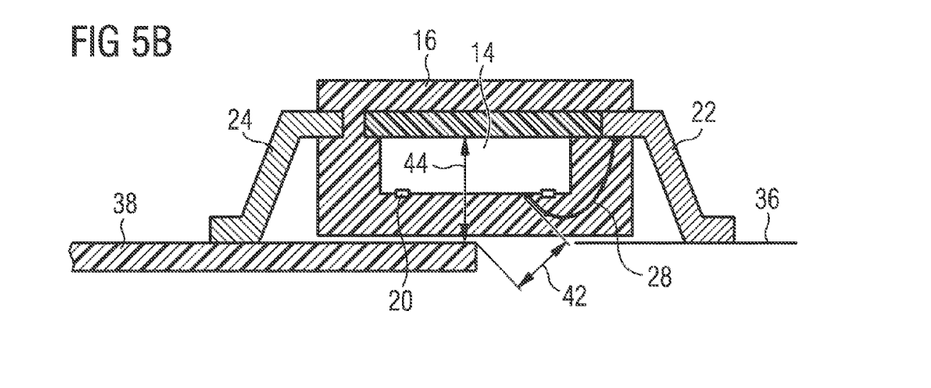
FIG. 5B illustrates a cross-sectional view of a chip package with an isolation lead attached to a component carrier according to an embodiment of the invention.

FIG. 5B illustrates a cross-sectional view of the chip package 10 with the isolation pin 24 attached (e.g., soldered) to the current trace 38. This cross-sectional view is taken along the lines 5B-5B in FIG. 5A. In this depicted example, a creepage distance 44 is present in addition to the creepage distance 42. The creepage distance 44 is the distance between the chip carrier 12 and the current trace 38. The chip carrier may be isolated from the chip, and may be attached (e.g., soldered) to the current trace.

Figure 6A:
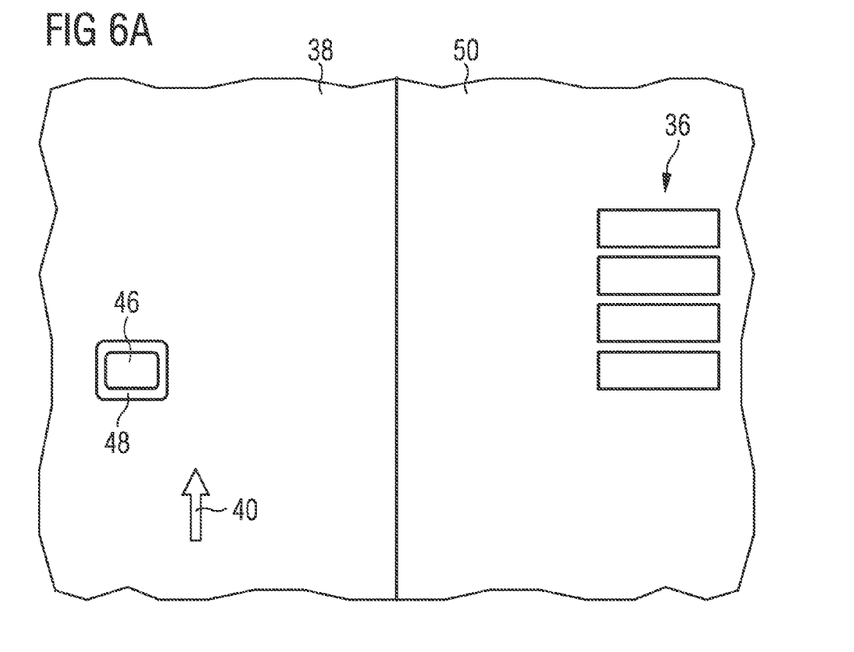
FIG. 6A illustrates an embodiment of a component carrier with an anchor pad.

FIG. 6A shows an alternative configuration for the current trace 38. In this example, an anchor pad 46 is disposed in or on the current trace 38 such that the anchor pad 46 is isolated from the current trace 38 by an isolation gap 48. The isolation gap 48 is a ring-shaped or cup shaped gap in this embodiment. In various other embodiments, the isolation gap may comprise a circular shape, oval shape, a rectangular shape or any other suitable geometrical shape. The anchor pad 46 may be isolated from the current trace 38 on its bottom surface.

The anchor pad 46 is isolated from the current trace 38 by the gap 48, but the creepage distance between the anchor pad 46 and the current trace 38 is smaller than creepage lengths needed for kilo-volt isolation. For example, the gap 48 may be only 0.1 millimeter wide, whereas creepage length for kilovolts applications may be several millimeters. The gap 48 may have different widths in other illustrative embodiments. In this example, the gap 48 may be formed by etching off material from the current trace 38. One purpose of the narrow isolation gap 48 is not to provide high-voltage isolation but to confine the solder to this island and to avoid current from the current trace to flow laterally over this solder junction.

Figure 6B:
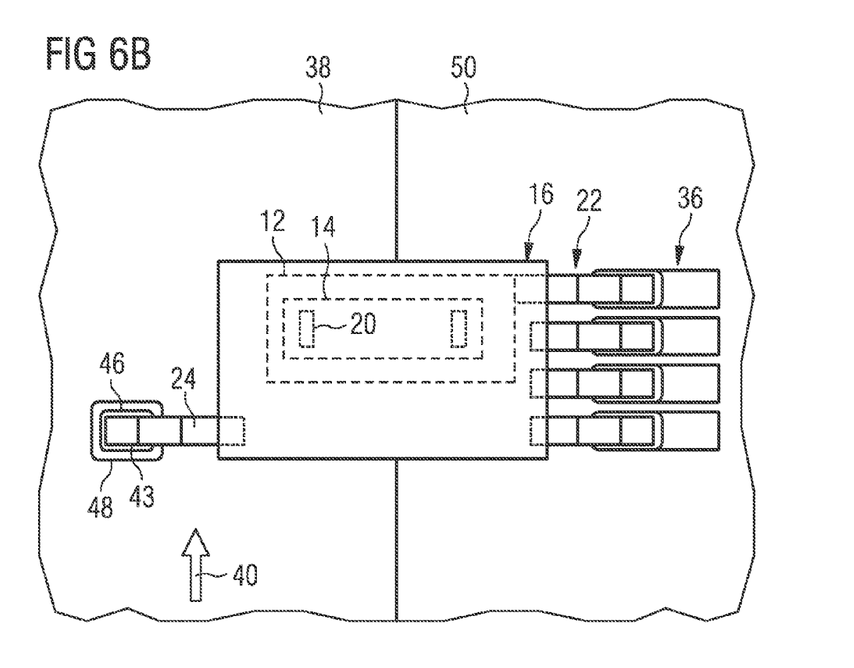
FIG. 6B illustrates a top view of a chip package attached to an anchor pad supported by a component carrier according to an embodiment of the invention.

FIG. 6B shows the chip package 10 attached (e.g., soldered) to the anchor pad 46 in or on the current trace 38. In this embodiment, the purpose of the gap 48 is to provide low voltage isolation between the current trace 38 from the solder 43. For example, solder 43 may (minimally) change a current distribution of the current trace. Soldering the isolation pin 24 to the isolated anchor pad 46 may not change the current distribution in the current trace 38 and therefore, does not negatively affect the accuracy of the magnetic field sensor 20.

In this example, the solder 43 attaches the isolation pin 24 to the anchor pad 46 but does not attach the isolation pin 24 directly to the current trace 38. Thus, the anchor pad 46 is electrically isolated from the current trace 38 and the isolation pin 24 is electrically isolated from other conductive components within the chip package 10. As a result, double isolation may be realized.

It may be unwanted that the isolation pin is electrically floating because the isolation pin may assume a potential between the high-voltage potential of the current trace 38 and the low-voltage circuit of the magnetic field sensor due to capacitive effects. This stray capacitances are poorly defined and may change over time, e.g. by moisture absorption of the component carrier or the mold compound. Therefore it may be advantageous to tie the isolation pin or its anchor pad to the high potential of the primary conductor 38. One possibility is given in FIG. 7A.

Figure 7A:
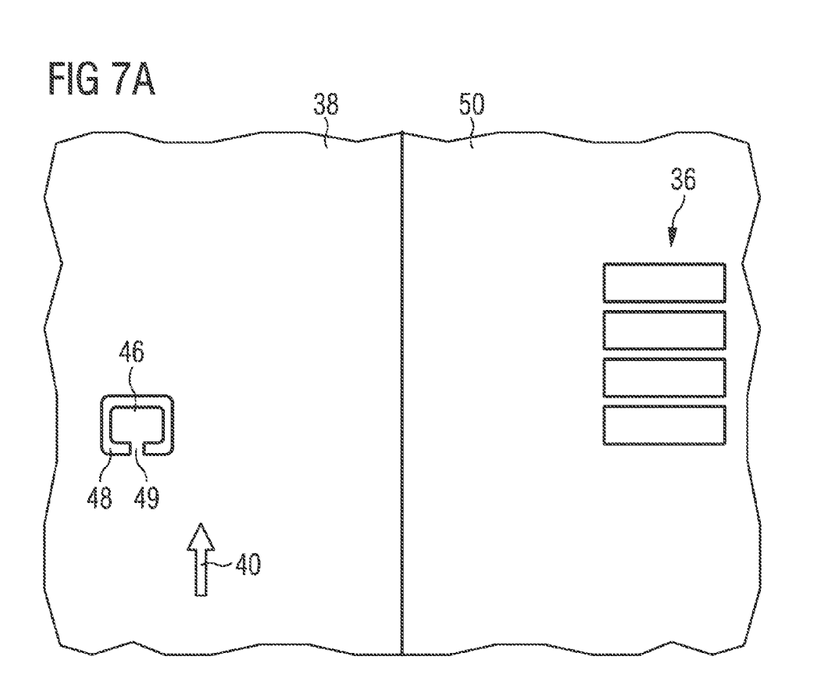
FIG. 7A illustrates another embodiment of a component carrier with an anchor pad.

FIG. 7A illustrates yet another configuration for the current trace 38. In this view, the anchor pad 46 is disposed within the isolation gap 48 but is galvanically connected to the current trace 38 via bridge 49. While the anchor pad 46 is connected galvanically to the current trace 38, no current can flow over the anchor pad 46. This geometry for the anchor pad 46 may provide advantageous because a very well-defined potential exists since the potential of the isolation pin 24 is not floating.

Figure 7B:
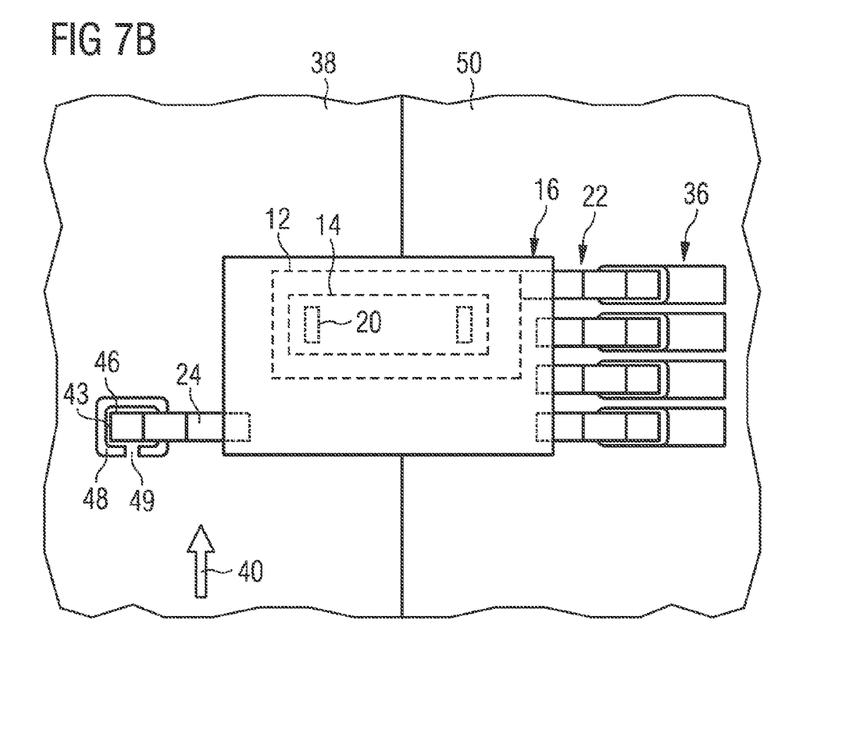
FIG. 7B illustrates a top view of a chip package attached to an anchor pad supported by a component carrier according to an embodiment of the invention.

FIG. 7B illustrates the chip package 10 attached (e.g., soldered) to the current trace 38 with the anchor pad 46. Because no current can flow over the anchor pad 46, the current distribution is not affected by the exact geometry of the solder 43 on the anchor pad 46.

In the previous embodiments, the chip package 10 is attached to a component carrier such as a printed circuit board (PCB). In various embodiments, the chip package 10 may be attached to alternative substrates having a main body of electrically isolating material (e.g. ceramic, glass, polymers), which carries electrically conducting traces (e.g. from copper or aluminium).

For example, the chip package 10 may be attached to DCB substrates (Direct Copper Bond) or IMS (Insulated Metal Substrates). Both substrates are used for high power circuits such as inverters or motor controllers. Both substrates comprise a single interconnect layer and the isolation pin may be soldered to the conductor in order to attach the chip package 10 firmly.

In various embodiments, the chip package 10 may be secured or attached to the component carrier in another manner other than soldering. For instance, the chip package 10 may be kept in place and contact may be made by ultrasonic welding or gluing with a conductive adhesive.

In some embodiments the isolation pin or isolation pad is disposed on a side of the chip package 10 where no galvanically connected pin or pad is located. In other embodiments the isolation pin or isolation pad is disposed on a side of the chip package 10 where no pin or pad is located.

Figure 8:
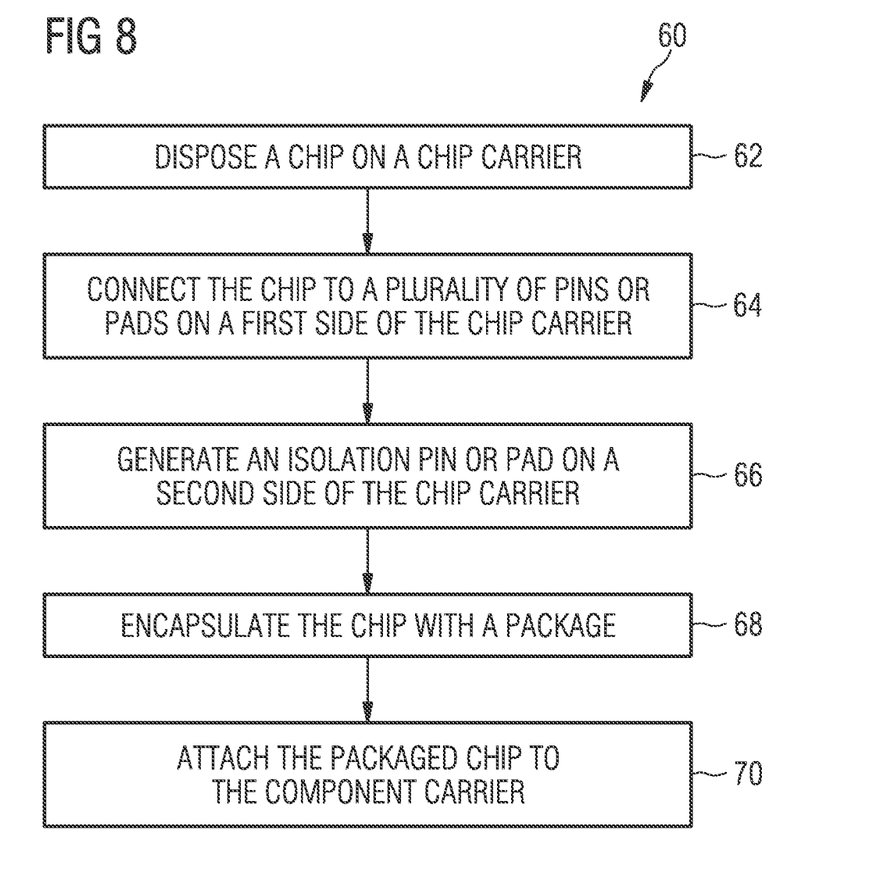
FIG. 8 shows a flowchart of a process for forming a chip package according to an embodiment of the invention.

FIG. 8 shows a flowchart 60 of a process for forming the chip package 10 according to an embodiment.

In a first step 62, the chip is disposed on the chip carrier. The chip includes a magnetic field sensor as described in detail in FIG. 1. The magnetic field sensor is configured to measure the current outside the chip package.

Next, in step 64, the chip is connected to a plurality of leads on a first side of the chip carrier. For example, one or more of the leads may be connected to the chip by wire bonding, clip bonding or ball bonding.

In step 66, the isolation pin is generated on a second side of the chip carrier. The isolation pin (or lead) may originally be part of the chip carrier when the chip is disposed on the chip carrier. As the manufacturing process continues, the isolation pin is severed or "stamped out" of the leadframe to become isolated at a desired distance from the rest of the leadframe (leads form the plurality of leads may be also served from the leadframe). In other examples, the isolation pin may be generated using a different process than described herein.

In step 68, the chip and the components associated with the chip are encapsulated with a housing or package. Depending on the functionality desired for the chip package, more or less of the leads and the isolation pin may be encapsulated. Further, when the chip package includes the die paddle, the die paddle may be entirely encapsulated or may have a portion external to the chip package. Thus, in some configurations of an illustrative embodiment, only isolation pads and/or pads may be exposed from the chip package.

In step 70, the chip package is attached to the component carrier by attaching the isolation pin or the isolation pad to a current trace disposed in a component carrier. For example, the isolation pin may be soldered to the current (or an isolated portion of the current) trace and the leads or pins may be soldered to the low-voltage sensor traces as shown in embodiments of FIGS. 5A-7B. When the current trace includes the anchor pad, the isolation pin may be soldered directly to that anchor pad. Alternatively, the isolation pin and the leads can be welded or glued/bonded/taped or fixed by other methods to the conductor and/or to the PCB.

The chip package manufactured according to the method described in this figure provides a chip package with a magnetic field sensor configured to measure a current outside of the package, in which the magnetic field sensor remains in a stable position relative to the current trace on which it is mounted.

Thus, various embodiments use a novel configuration of the chip package in relation to the current trace on the component carrier. Particularly, by electrically isolating a pin protruding from or isolating pad on one side of the chip package, the chip package may be mechanically attached to the component carrier in a manner that avoids galvanic contact and inadequate creepage distance between the current trace and the chip package. Moreover, the mechanical connection between the isolation pin or the isolation pad and the component carrier increases the stability of the assembly. As a result, various embodiments provide devices that increase the reliability of the magnetic field sensor over the lifetime of the chip package.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A chip package comprising:
   a chip;
   a package encapsulating the chip;
   pads or pins disposed on a first side of the package; and
   an isolation pad or an isolation pin disposed on a second side of the package, the isolation pin or the isolation pad electrically isolated from the chip, wherein the isolation pad or the isolation pin is configured to be structurally affixed to an anchor pad of a current trace, the current trace at least partially overlapping the package encapsulating the chip and extending at least partially past an edge of the package, wherein the anchor pad of the current trace is either completely electrically isolated from the current trace or electrically isolated from the current trace except at a bridge, and
   wherein the chip comprises a magnetic field sensor configured to measure a magnetic field generated outside of the package.

2. The chip package according to claim 1, wherein the first side is opposite the second side.

3. The chip package according to claim 1, wherein the first side is adjacent to the second side.

4. The chip package according to claim 1, further comprising an additional isolation pin or an additional isolation pad electrically isolated from the chip.

5. The chip package according to claim 1, wherein no other pin or pad, or no other isolation pin or pad is disposed on the second side.

6. The chip package according to claim 1, wherein no other pin or pad is disposed on the second side.

7. The chip package according to claim 1, further comprising a chip carrier, the chip disposed on the chip carrier.

8. The chip package according to claim 7, further comprising an isolation layer, the isolation layer disposed between the chip and the chip carrier, wherein the isolation layer comprises a larger area than the chip.

9. The chip package according to claim 7, further comprising a platelet, the platelet disposed between the chip carrier and the chip.

10. The chip package according to claim 9, wherein a bottom side of the chip carrier is exposed and not covered by a package material of the package.

11. The chip package according to claim 1, wherein the isolation pin or the isolation pad is electrically isolated from the chip to withstand a breakdown voltage of at least 300 V.

12. A system comprising:
a packaged chip including
a chip;
a package encapsulating the chip;
pins or pads disposed on a first side of the package; and
an isolation pin or an isolation pad disposed on a second side of the package, the isolation pin or the isolation pad electrically isolated from the chip, wherein the chip comprises a magnetic field sensor configured to measure a magnetic field generated outside of the package; and
a component carrier comprising a current trace,
wherein the isolation pin or the isolation pad is attached to the current trace of the component carrier, wherein the pins or the pads are attached to component carrier pads disposed in a distance from the current trace, wherein the current trace comprises an anchor pad, the anchor pad being either completely electrically isolated from the current trace or electrically isolated from the current trace except at a bridge, and wherein the isolation pin or the isolation pad is attached to the anchor pad.

13. The system according to claim 12, wherein the anchor pad is completely electrically isolated from the current trace.

14. The system according to claim 12, wherein the anchor pad is electrically isolated from the current trace except at the bridge.

15. The system according to claim 12, further comprising a chip carrier, wherein the chip carrier is soldered to the current trace, and wherein the chip carrier is isolated from the chip.

16. The system according to claim 12, wherein the isolation pin or the isolation pad is soldered to the current trace of the component carrier, wherein a package material is disposed between chip carrier and the current trace, and wherein the chip carrier is isolated from the chip.

* * * * *